(12) United States Patent
Kalinowski et al.

(10) Patent No.: US 6,357,414 B1
(45) Date of Patent: Mar. 19, 2002

(54) AIR MANIFOLD MOUNTING FOR ENGINE CONTROL CIRCUITRY

(75) Inventors: Pawel Kalinowski, Birmingham; Bharat Z. Patel, Canton; Timothy J. Yerdon, Plymouth; John Trublowski, Troy; Prathap A. Reddy, Farmington Hills; Harvinder Singh, Shelby Township, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/553,009

(22) Filed: Apr. 20, 2000

Related U.S. Application Data
(60) Provisional application No. 60/130,860, filed on Apr. 22, 1999.

(51) Int. Cl.[7] .................................................. F01P 1/06
(52) U.S. Cl. .................................................. 123/198 E
(58) Field of Search ........................ 123/184.61, 195 C, 123/198 E, 468, 41.31

(56) References Cited

U.S. PATENT DOCUMENTS

| | | | | | |
|---|---|---|---|---|---|
| 4,339,260 | A | * | 7/1982 | Johnson et al. ................ | 65/160 |
| 4,893,590 | A | * | 1/1990 | Kashimura et al. ...... | 123/41.31 |
| 5,207,186 | A | * | 5/1993 | Okita ...................... | 123/41.31 |
| 5,988,119 | A | * | 11/1999 | Trublowski et al. ..... | 123/41.31 |
| 6,186,106 | B1 | * | 2/2001 | Glovatsky et al. ...... | 123/184.61 |

* cited by examiner

*Primary Examiner*—Henry C. Yuen
*Assistant Examiner*—Hyder Ali
(74) *Attorney, Agent, or Firm*—John Kajander

(57) ABSTRACT

Central mounting of control electronics proximate to the engine is provided by attaching the electronics to an upper surface of the intake manifold to provide heat shielding and heat conduction for active components on the circuit card. The central location provides extremely short harnesses to important actuators located in cylinder heads of the engine thus reducing wiring clutter and cost.

20 Claims, 9 Drawing Sheets

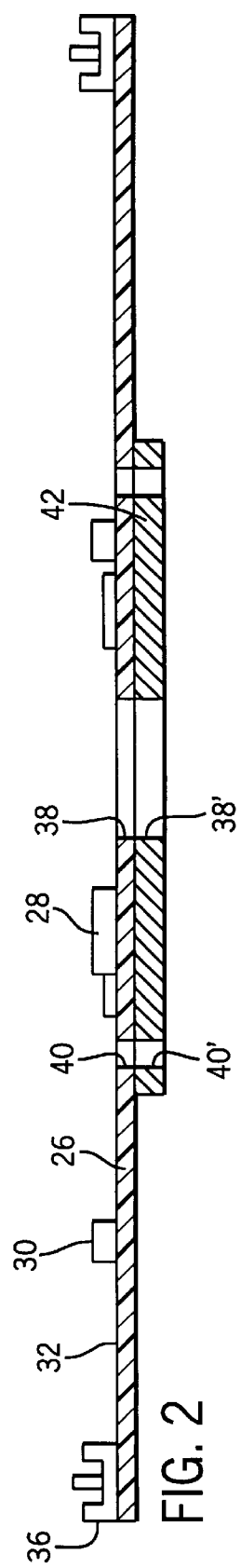
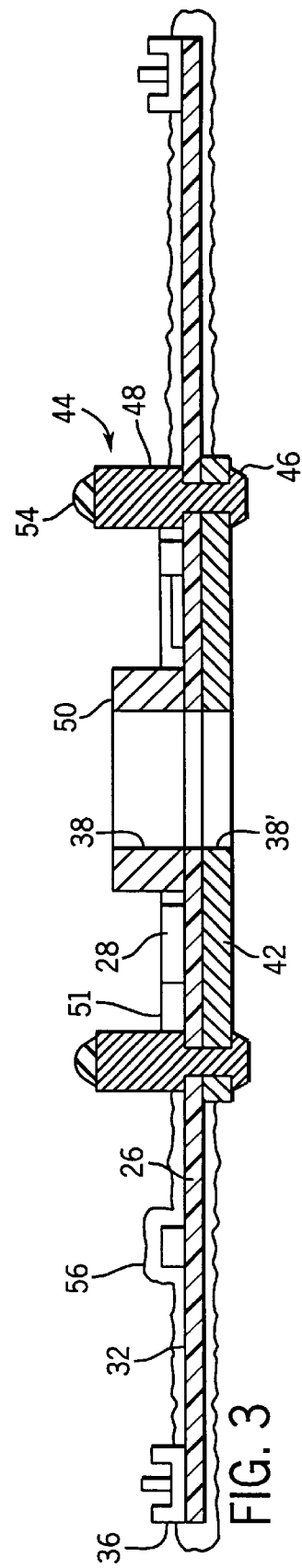

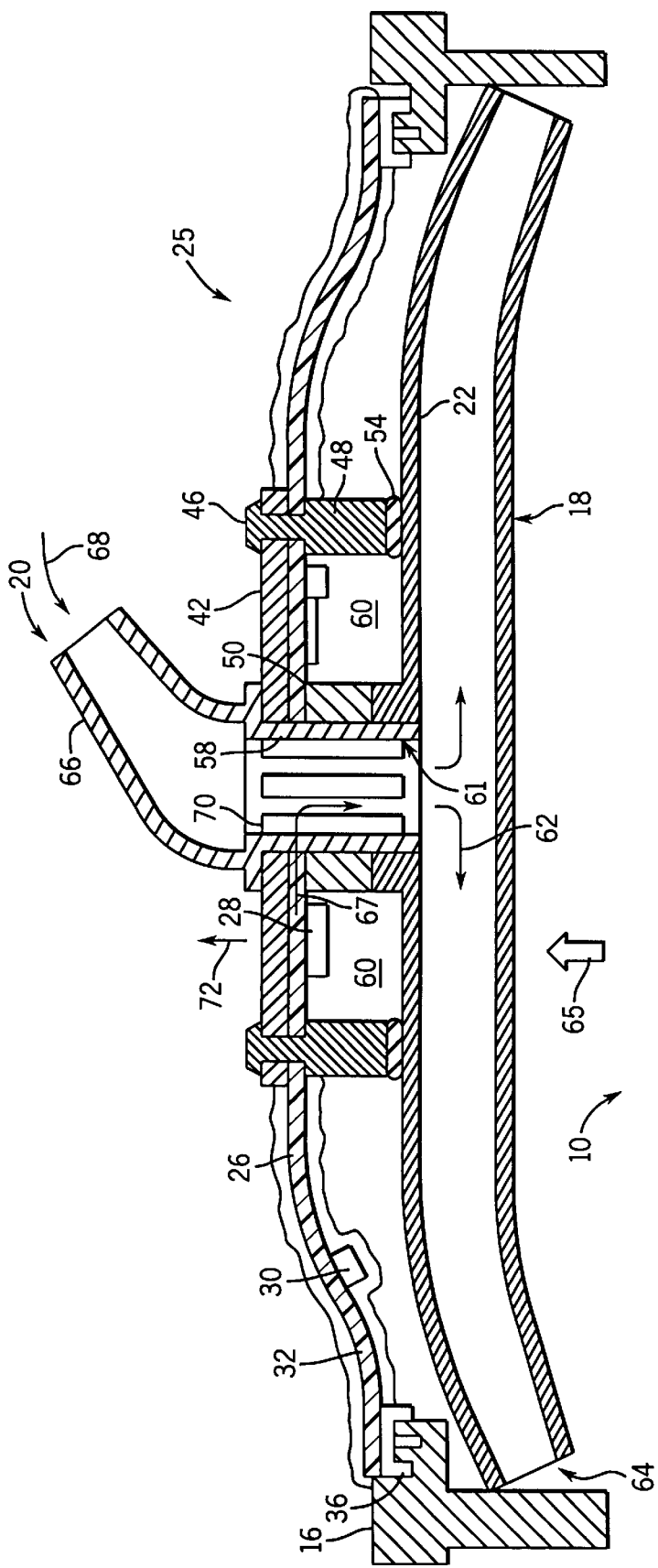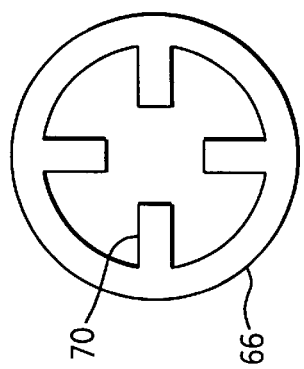
FIG. 4
FIG. 5

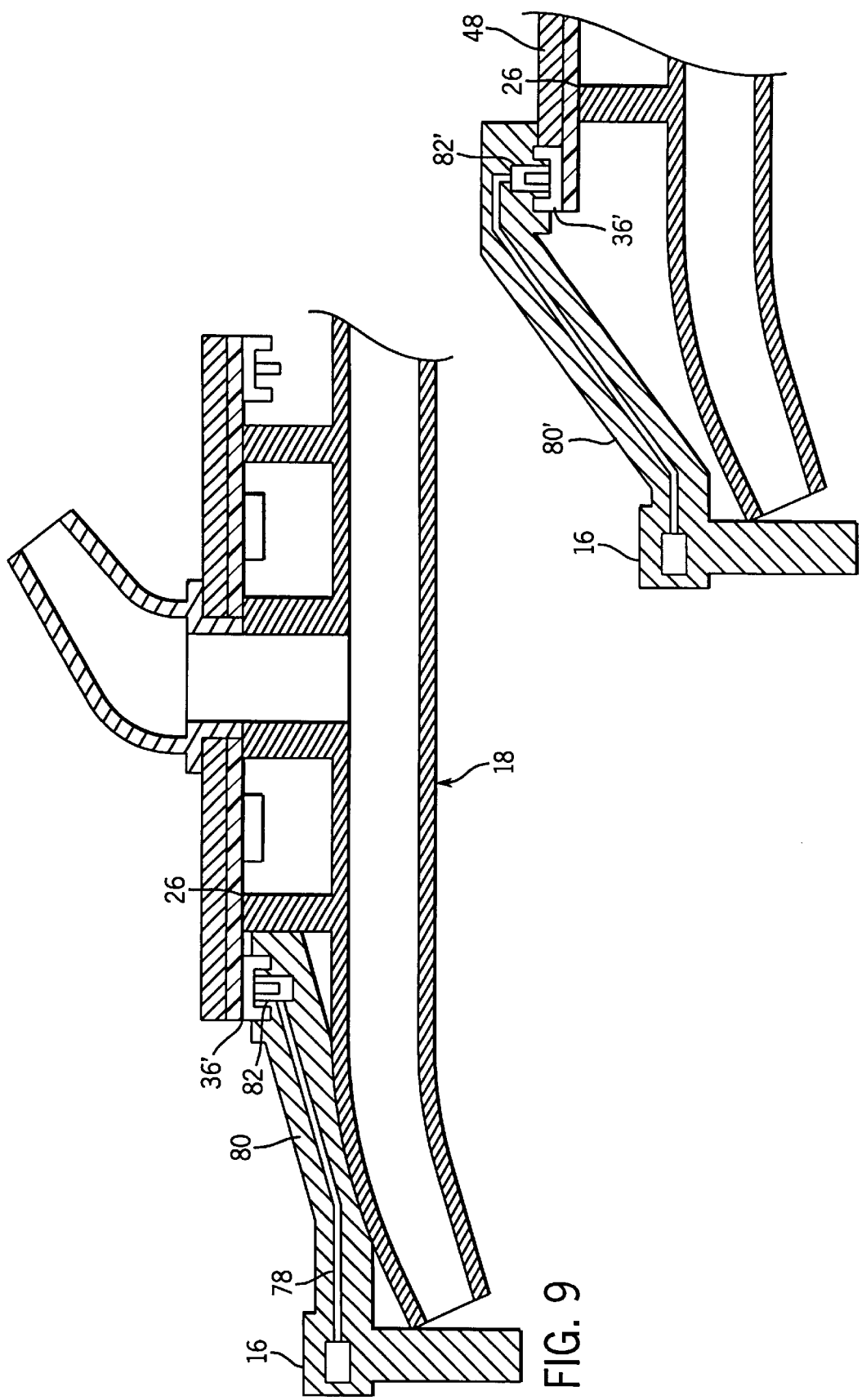

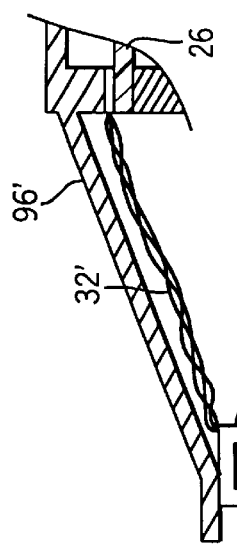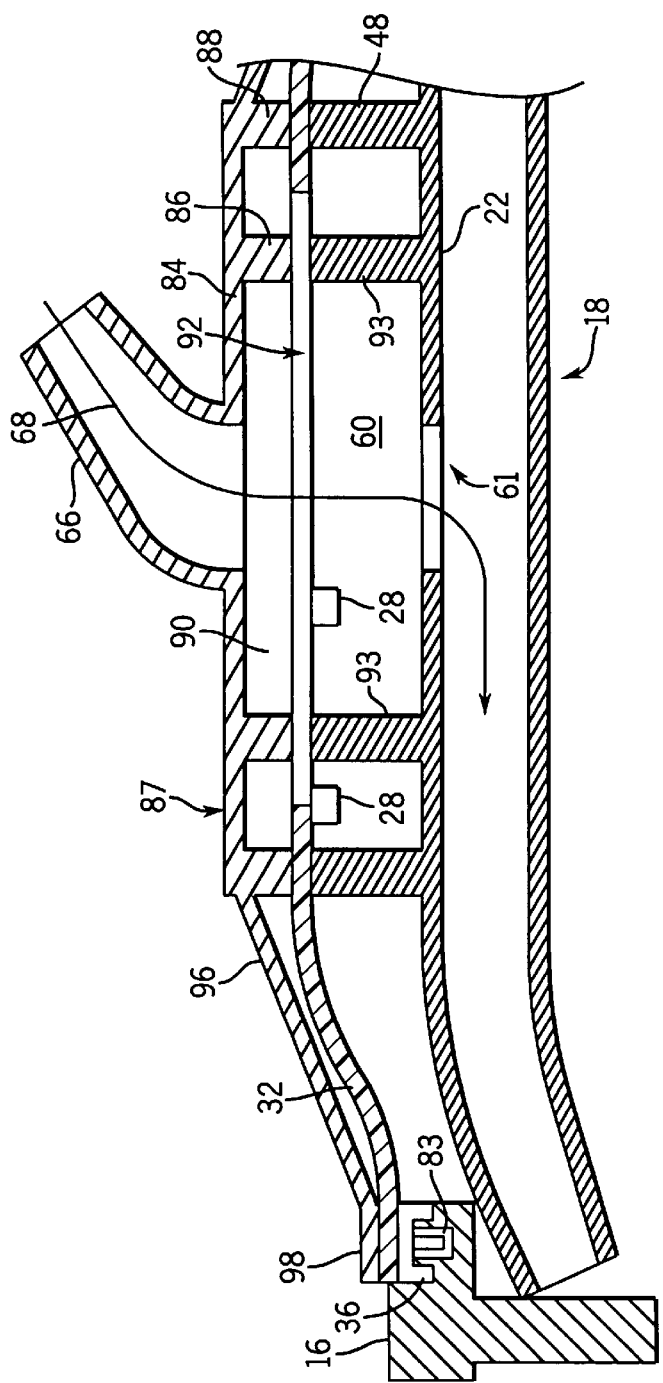

AIR MANIFOLD MOUNTING FOR ENGINE CONTROL CIRCUITRY

CROSS-REFERENCE TO RELATED APPLICATIONS

This application claims priority to Provisional Appln. No. 60/130,860, filed Apr. 22, 1999.

STATEMENT REGARDING FEDERALLY SPONSORED RESEARCH OR DEVELOPMENT

BACKGROUND OF THE INVENTION

The present invention relates generally to automotive electronics and in particular to a method of simplifying control wiring within the engine compartment by mounting control electronics on the air intake manifold.

Internal combustions used in automobiles and the like employ sophisticated engine control technologies making use of a variety of sensors and actuators and communication with microprocessor-based control circuitry. Generally engine control provided by these systems offers increased performance, reduced emissions and higher reliability in the operation of the vehicle.

Currently, the microprocessor-based control circuitry may be located near the vehicle firewall to provide a secure mounting of the circuitry away from the high temperature components of the engine and communicating with driver instrumentation in the passenger compartment.

The control circuitry communicates with a variety of sensors on or close to the engine including, for example, sensors for air mass flow, engine temperature, throttle position, engine speed and crankshaft position. The control circuitry in receiving these sensor signals, produces actuator signals to control throttle valves, fuel injectors, ignition coils, engine valves and the like.

The sensors and actuators must be connected to the control circuitry by wiring and the wiring must be of sufficient gauge to resist breaking under the tensile load and flexures incident to the normal service. The wires are therefore typically bound together in "harnesses" to improve their mechanical resilience and may be sheathed to better resist abrasion.

Wiring harnesses represent a significant cost in manufacturing of the vehicle, not only in cost of material and manufacture, but also in costs of routing and connection to the sensors and actuators. Mechanically robust harnesses add weight to the vehicle affecting vehicle mileage and emissions. The harness with its attendant branching wire sets can increase the clutter in the engine compartment adversely affecting the assembly, maintenance and repair of the engine. Further, long wire harnesses are a source of Electromagnetic Interference (EMI) which may adversely affect the performance of all vehicle electronics.

BRIEF SUMMARY OF THE INVENTION

The present inventors have recognized that a significant number of actuators are concentrated near the heads of the engine cylinders. Accordingly, placement of the control electronics at a central location between the engine cylinders can significantly reduce wiring. The sensitivity of the electronics to high temperatures normally occurring near the engine may be solved by a special circuit carrier supported by the intake manifold that may block the transmission of heat to the circuitry from the engine and may remove heat internally generated by such circuitry.

Specifically, the present invention provides an intake manifold circuit carrier including an air intake manifold providing chamber walls conducting air from a throttle body opening to a plurality of exit ports associated with locations of cylinders on an internal combustion engine. Support walls are provided extending outwardly from the chamber walls to define a volume adjacent to the chamber walls. The circuit board having circuit components mounted thereon and including a first aperture is attached to a heat conductive plate on the first side of the circuit board, the heat conductive plate being in thermal communication with it to form a laminated plate assembly. The heat conductive plate has a second aperture aligned with the first aperture in the circuit board and the laminated plate assembly is attached to an upper edge of the support walls to cover the volume with the circuit board internal to the heat conductive plate with respect to the volume.

Thus, it is one object of the invention to create a hospitable environment for temperature sensitive electronic components near the actuators associated with engine cylinders.

A throttle body may be included having a central lumen and attached to the laminated plate assembly with the lumen aligned with the first and second apertures so as to place the throttle body in thermal communication with the heat conductive plate. The throttle body may include fins projected inward to the lumen to conduct heat from the throttle body to air passing across the fins.

Thus it is another object of the invention to provide a path of heat conduction away from the electronics into the air normally aspirated by the engine.

The support walls may be molded of heat conductive plastic or may be an integral part of the intake manifold.

Thus it is another object of the invention to provide a path of heat conduction into the air normally drawn through the chamber walls of the intake manifold.

The short harnesses required between the circuit card and the actuators on the cylinder heads may be conventional wire harnesses terminating in electrical connectors that may connect to the actuators or may be extensions of a flexible circuit board substrate of the circuit board terminating in electrical connectors or may be a conductor assembly (for example, a rigid plastic) having electrical connectors attached to corresponding connectors on the printed circuit board and also attached to the control component or may be conductors attached directly to the air intake manifold.

Thus it is another object of the invention to provide great flexibility in the construction of the harnesses based on their short length and close proximity to the control actuators.

In an alternative embodiment of the invention, the intake manifold circuit carrier may include an air intake manifold providing chamber walls conducting air from an entrance port to a plurality of exit ports associated with locations of the cylinders on an internal combustion engine. Support walls may extend outward from the chamber walls to define a volume adjacent to the chamber walls. A circuit board having circuit components mounted thereon may be sandwiched between the upper edge of the support walls and a cover shroud attachable at the upper edge of the support walls, the cover shroud when so assembled, providing air channels conducting air from a throttle body port in the cover shroud pass the circuit board leading to the entrance port of the air intake manifold.

Thus it is another object of the invention to provide direct airflow of aspirated engine air across the circuit board to provide cooling thereof.

The foregoing and other objects and advantages of the invention will appear from the following description. In this description, reference is made to the accompanying drawings, which form a part hereof, and in which there is shown by way of illustration, a preferred embodiment of the invention. Such embodiment and its particular objects and advantages do not define the scope of the invention, however, and reference must be made therefore to the claims for interpreting the scope of the invention.

BRIEF DESCRIPTION OF THE DRAWINGS

FIG. 2 is a cross-section taken along lines 2—2 of FIG. 1 of a circuit card used in the carrier of the present invention as constructed of a flexible substrate having extensions forming harnesses and as attached to a heat conductive plate;

FIG. 3 is a view similar to that of FIG. 2 showing the attaching of side walls and a gasket material to the circuit card and a coating applied to the exposed portions of the harness extensions;

FIG. 4 is a figure similar to that of FIG. 2 showing the circuit card inverted and placed on inner and outer support walls of the circuit carrier of the present invention attached to the manifold of FIG. 1 and to a throttle body and showing paths of heat conduction from the components on the circuit card FIG. 5 is an axial cross-sectional view of the throttle body of FIG. 4 showing radially inward extending fins;

FIG. 9 is a figure similar to FIGS. 4 and 6–8 showing yet an alternative embodiment in which circuit card based connectors attached to upwardly connectable connectors being part of the actuators controlled by the control electronics;

FIG. 10 is an alternative embodiment of the embodiment of FIG. 9 showing the use of downwardly extending conductors on the actuated components;

FIG. 11 is a view similar to FIGS. 4 and 6–11 showing an additional alternative embodiment in which a cover shroud is used to conduct aspirated air destined for the intake manifold across the circuit card and having extending portions for holding connections against vibration and including holes for passing air through the circuit card;

FIG. 12 is an alternative embodiment of the extended portions of FIG. 11 for use with a wire harness such as may also be used with other embodiments;

DETAILED DESCRIPTION OF THE INVENTION

Figure 1:
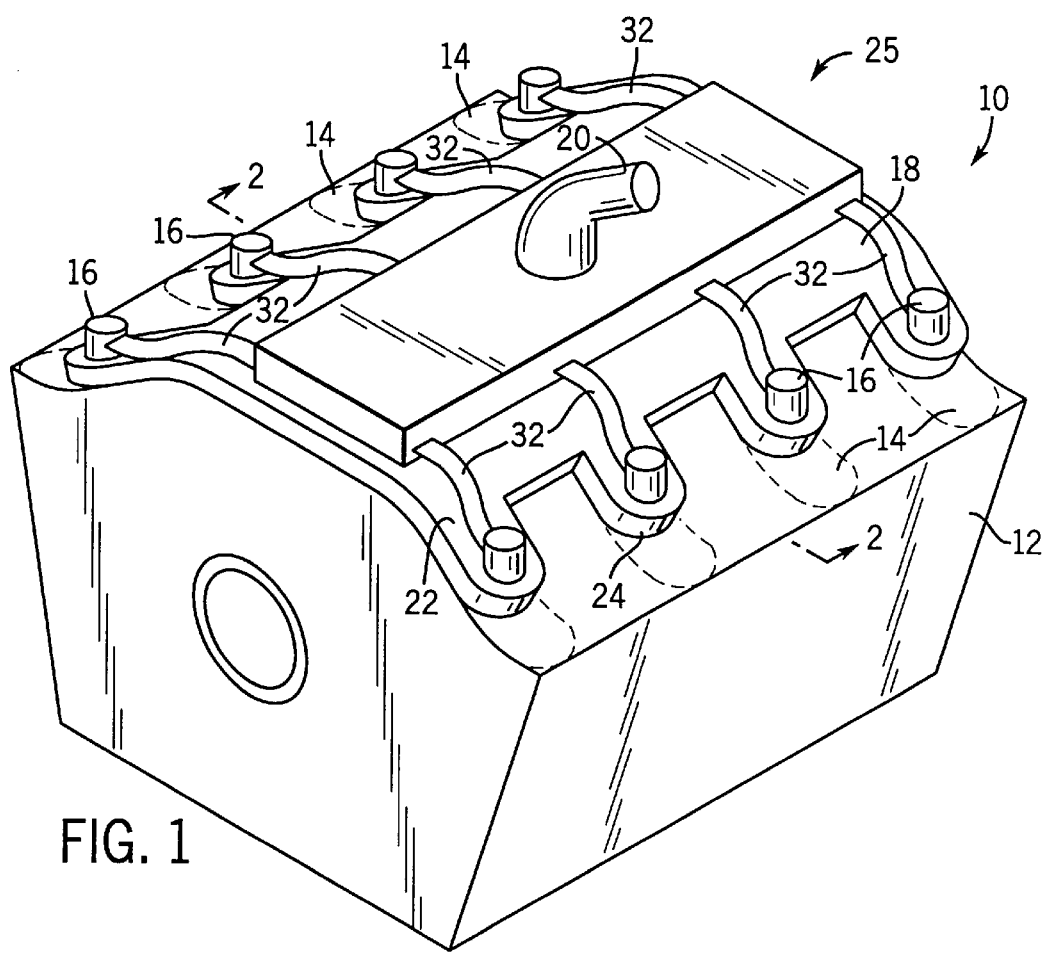
FIG. 1 is a simplified perspective view of an engine showing location of the engine cylinders in phantom and the position of the air intake manifold beneath the circuit carrier of one embodiment of the present invention.

Referring now to FIG. 1, an engine 10 suitable for use with the present invention provides an engine block 12 having a plurality of cylinders 14 at whose heads may be various actuators 16. Currently, such actuators 16 include fuel injectors and ignition coils but in the future it is expected that such actuators 16 may also include engine valves and possibly sensing electronics.

An air-intake manifold 18 leads generally from an inlet 20 to conduct air within chamber walls 22 to exit ports 24 at the heads of the cylinders 14 according to methods well known in the art.

In the present invention, a circuit carrier 25 may be positioned centrally about the inlet 20 approximately centered between the cylinders 14. While as depicted, the engine 10 is in a V-configuration with the circuit carrier 25 substantially at the center of the cylinders 14, it will be understood from the following description that the invention may also be used for in-line engine configurations with the circuit carrier 25 positioned to the side of the cylinders 14 on the intake manifold.

Figure 13:
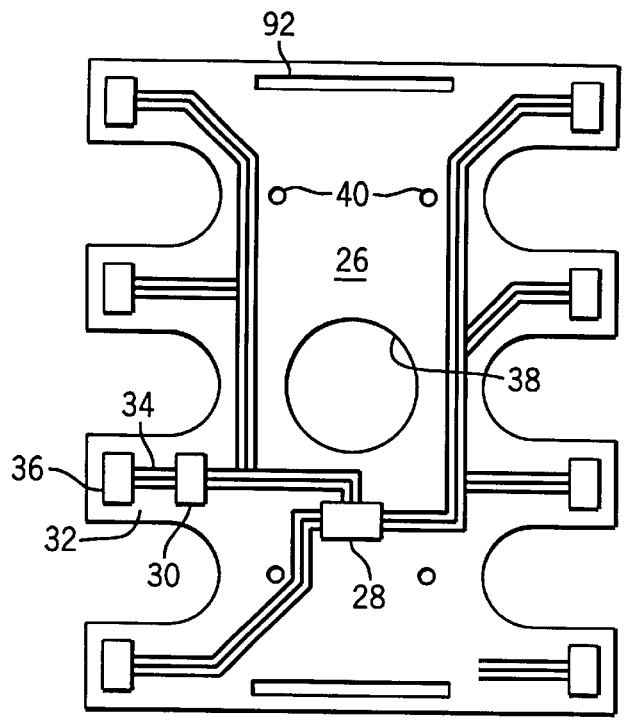
FIG. 13 is a plan view of the circuit card of FIG. 6 showing formation of harnesses through extensions of a flexible printed circuit board media.

Referring now to FIGS. 2 and 13, a circuit board 26 holding engine control electronics may include mounted on its surface, active components 28 and passive components 30 distinguished principally by their sensitivity to high temperature and their generation of internal heat. The active components 28 need generally a lower ambient temperature than the passive components 30. The active components 28 are centrally mounted on the circuit board 26 while the passive component 30 may be mounted on harness portions 32 shown more clearly in FIG. 13.

As will be described below, the harness portions 32 provide harness-like structures allowing connection of active components 28 and 30, as connected by conductive traces 34 of the circuit board 26, to the actuators 16 in the function of wiring harnesses. The harness portions 32 may be cut out of a single flexible substrate of the circuit board 26 or cut from separate flexible circuit board substrate and attached at a subsequent manufacturing step by soldering, welding or other methods known in the art.

The conductive traces 34 connects components 30 and 28 also to connectors 36 at the ends of the harness portions 32 such as may be received by other connectors on actuators 16 (shown in FIG. 4, for example). A central aperture 38 may be cut in the circuit board 26 as will align with the throttle body 66 as described below as well as mounting apertures 40 whose use will also be described.

Referring specifically to FIG. 2, a thermally conductive plate 42, for example of an aluminum or magnesium material, may be attached to the rear side of the circuit board 26 opposite the components 28 and 30 to be electrically insulated from the conductive traces 34 (except perhaps for a ground connection) but thermally communicating with the active components 28. The thermally conductive plate 42 may be glued to the rear side of the circuit board 26 with thermally conductive glues such as are known in the art. The conductive plate 42 may have an aperture 38' and 40' commensurate with apertures 38 and 40 and aligned with them when the conductive plate 42 is attached to the circuit board 26.

Referring now to FIG. 3, a support frame 44 may be injection molded about the combined conductive plate 42 and circuit board 26 through in-molding techniques well known in the art in which molded rivets 46 pass through the combined apertures 40 and 40' so as to retain the conductive plate 42 against the circuit board 26 and to hold the support frame 44 thereto. In a preferred embodiment, the support frame 44 is molded of a thermally and electrically conductive plastic, provided by the inclusion of metal particles in a thermal plastic binder, to provide heat conduction and shielding from electromagnetic interference.

The support frame 44 provides an upwardly extending outer wall 48 defining the periphery of the active components 28 and the conductive plate 42 and upwardly extending inner walls 50 ringing the apertures 38 and 38', the two joined by one or more ribs 51.

An elastomeric seal 54 may be molded on the top of the walls 48 and the harness portions 32 may be covered with an elastomeric protecting material 56, of types well known in the art, to protect them against abrasion and short-circuiting of their surface conductors.

Referring now to FIG. 4, the air intake manifold 18 generally provides in the upper chamber wall 22 an entrance aperture 61 for conducting engine intake air 62 as shown by like numbered arrows to exit ports 64 associated with each cylinder 14 shown in FIG. 1. Engine actuator component 16 may be mounted to the air intake manifold 18 or merely affixed relative to the exit ports 64.

The assembly of FIG. 3 may be inverted and placed against the air-intake manifold with the upper edges of the walls 48 and 50 (per the orientation of FIG. 3) abutting upper chamber walls 22 of an air intake manifold 18. In this configuration, the seals 54 arc compressed against the upper chamber wall 22 so that the walls 48 and 50 in touching the upper chamber wall 22 define an enclosed volume 60 in which the active components 28 are held.

As shown in FIG. 4, the interposition of the air-intake manifold 18 between the remainder of the engine 10 and the circuit board 26 allows flowing air 62 to collect heat 67 generated by the active components 28 themselves.

The throttle body 66, conducting aspirated air 68, may provide additional cooling to the volume 60 by conduction through throttle body walls 58 as augmented by internal fins 70 in the throttle body 66 in a portion passing between walls 50. Referring to FIG. 5, the fins 70 may extend radially inward within the central lumen of the throttle body 66. The fins are designed to provide minimal airflow restriction through the assembly. The throttle body 66 may rest against the conductive plate 42 to provide good thermal communication between that plate and the air 68 flowing through the throttle body 66. When the engine is not running, additional heat flow paths 72 may occur through the conductive plate 42 from the volume 60 to ambient air.

Referring to FIGS. 4 and 13, the flexible harness portions 32 allow connectors 36 to be connected directly to the actuators 16 resulting in very short effective harnesses.

Figure 6:
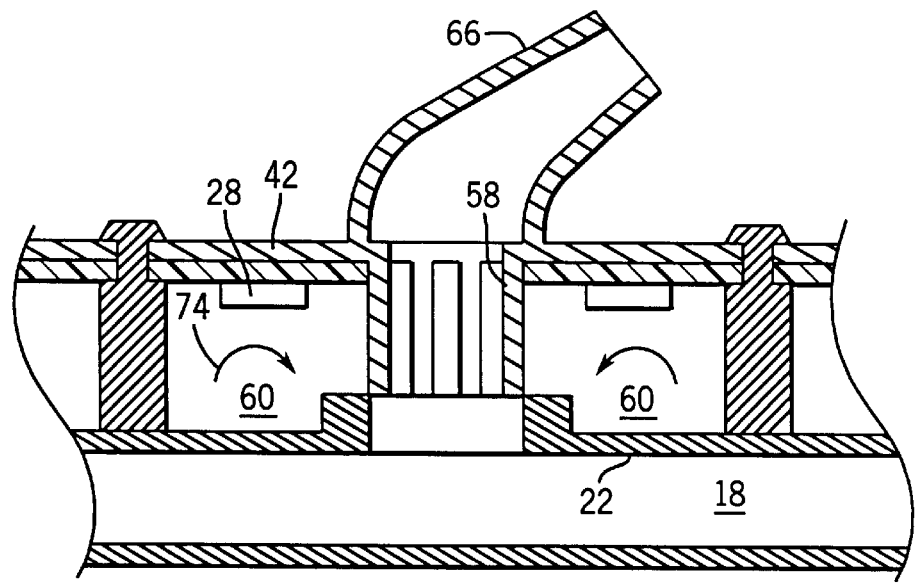
FIG. 6 is a fragmentary view similar to that of FIG. 4 showing a second embodiment in which the inner support walls are removed and the walls of a throttle body provide direct heat conduction to aspirated air and wherein the throttle body is integrated with heat conductive plate.

Referring now to FIG. 6, in an alternative embodiment, the throttle body 66 may be an integral part of the conductive plate 42 thus simplifying construction and improving heat flow between the two. Further, the inner wall 50 may be omitted allowing direct connection of the volume 60 to the throttle body wall 58. These two variations may be used individually as will be understood from this description.

Figure 7:
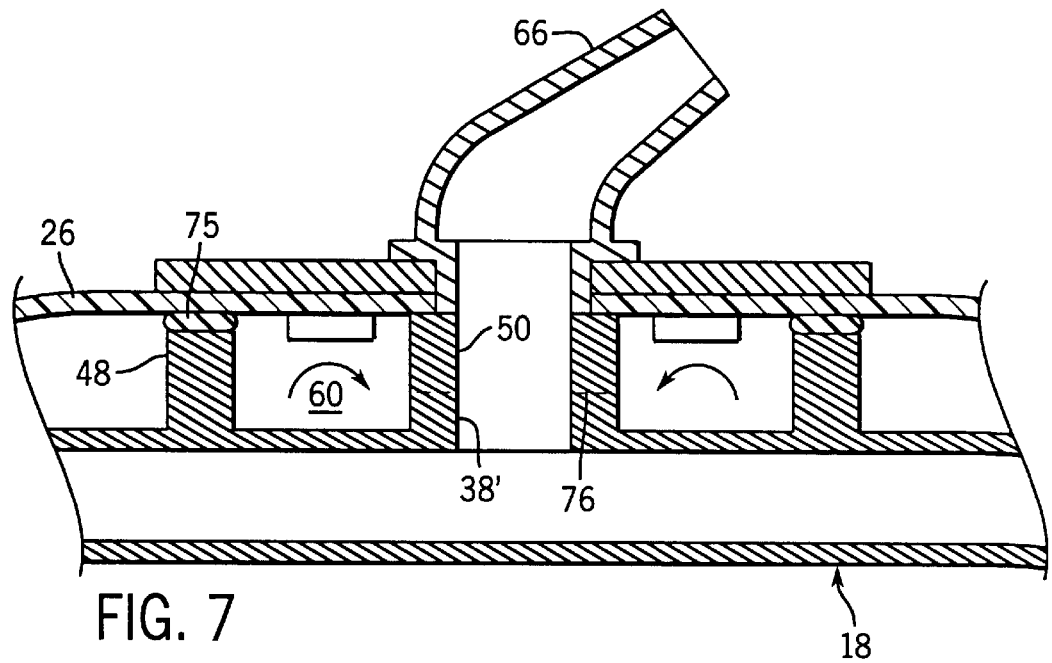
FIG. 7 is a figure similar to that of FIG. 6 showing a third embodiment wherein the support walls are integral extensions of the air intake manifold.

Referring now to FIG. 7, in another alternative embodiment, the walls 48 and 50 may be extensions from the air-intake manifold 18, for example, cast as part of the metal casting of the air-intake manifold 18 or molded as part of a plastic molding of the air-intake manifold 18. In this case, the thermal conductivity of the walls 48 and 50 to the air-intake manifold 18 may be improved. An elastomeric material 75 may be placed on the circuit board 26 so as to provide good sealing between walls 48 and 50 and the circuit board 26.

The portion of the throttle body 66 passing between the walls 50 may be eliminated or per the embodiments of FIGS. 4 and 6 include a finned portion that passes through apertures 38 to be assembled in a sleeve-like configuration with walls 50 may be cut down to dotted line 76.

In previous embodiments, the harness portions 32 were formed by flexible extensions of the circuit board 26. In an alternative embodiment of FIG. 8, the circuit board 26, which may be either on a flexible or rigid substrate, terminates at the edge of the conductive plate 42. A connector 36' may be attached directly to the circuit board 26 either as a separate component soldered to the circuit board 26 or by making use of the traces of the circuit board as connector elements as held in a molded shell. In either case, wall 48 then incorporates a mating connector half 82 communicating with conductors 78 embedded in or on the air-intake manifold 18 itself. In this way, assembly of the circuit board 26, conductive plate 42, and throttle body 66 to the air-intake manifold 18 also provides electrical connections to the actuators 16.

The conductor 78 may be in-molded to a high temperature plastic material or may be attached to the surface of a metal casting or the like using adhesives or other techniques. A second connector 83 may be incorporated into the actuators 16 to receive the conductor 78 emerging from the air-intake manifold 18 as connector 36'. This allows attachment of the actuators 16 to the air-intake manifold 18 to provide for their electrical connection as well. In this case, the air-intake manifold 18 provides support structure for the conductor 78 avoiding the need for other structural components.

Figure 8:
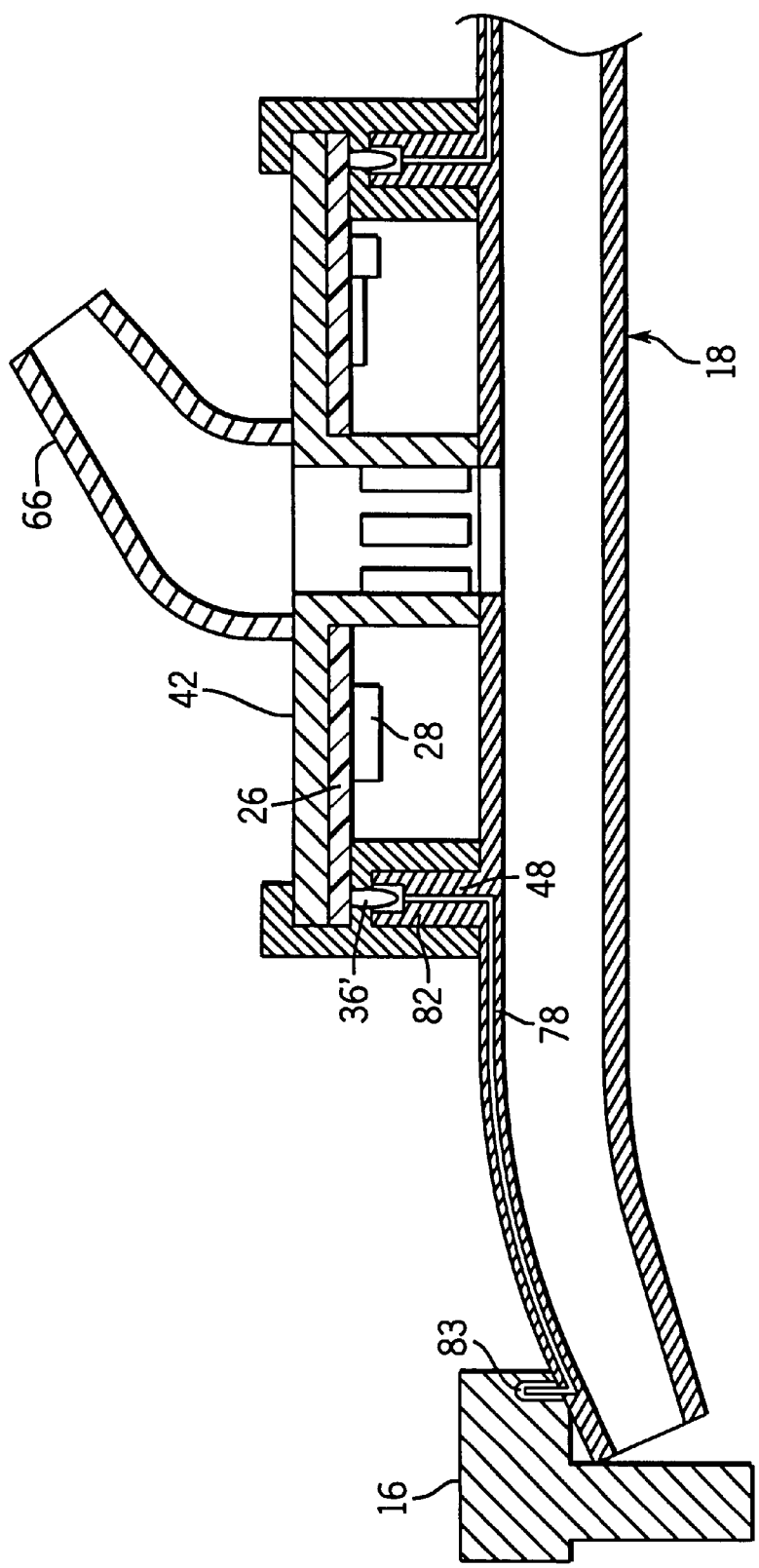
FIG. 8 is a view similar to that of FIGS. 4 and 6–7 of a fourth embodiment in which the circuit card extensions are eliminated in favor of connectors connecting through the support walls to the intake manifold carrying conductors therein or on its surface.

Referring now to FIG. 9, in a variation on the embodiment of FIG. 8, the downwardly extending connectors 36' may be received by conductor support structure 80 being a rigid thermoplastic support formed as part of the actuators 16 or attached thereto and providing a path for conductor 78 and support of connector half 82. Connector half 82 is positioned to join with the connector 36' when the circuit board 26 is assembled to the air-intake manifold 18. In this way, the air-intake manifold 18 need not be modified or in the case of failure of the internal conductor 78, need not be replaced.

Referring now to FIG. 10, a similar arrangement may be provided with a connector 36" extending upward from circuit board 26 past conductive plate 42 to connect with downward connector half 82' attached to rigid support structure 80' (similar to structure 80 but holding connector half 82') to attach to connector 36" after the circuit board 26 is assembled to the intake manifold 18. Again the support structure 80' includes an internal conductor 78 communicating with actuators 16. In this case, the structure 80' may serve to retain circuit board 26 in its position after it has been so assembled and may be an integral part of the actuator 16 eliminating the need for a second connector pair.

Referring now to FIG. 11, in a further embodiment, throttle body 66 may be attached to a shroud cover 87 having a generally planar plate 84 extending parallel to the circuit board 26. The plate 84 is in substantially the same alignment as the conductive plate 42 described above but spaced from the circuit board 26 by downwardly extending bosses 86 and a peripheral wall 88 defining a chamber 90 between an upper surface of the board 26 and a lower surface of the plate 84. This chamber 90 allows free circulation of aspirated air 68 along the upper surface of the circuit board 26.

Figure 14:
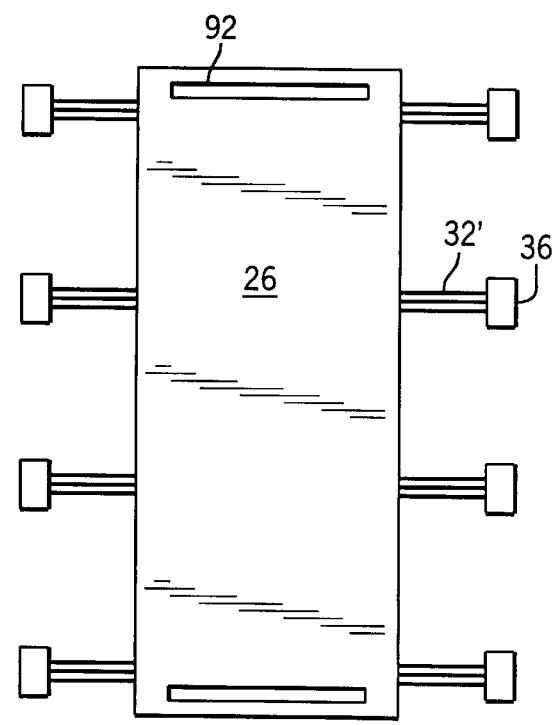
FIG. 14 is an alternative embodiment of the circuit card such as may be used in the embodiment of FIGS. 10 and 11 showing wire harness extensions.

The central aperture 38 of the circuit board 26 need not be present in this case but instead vent slots 92 as shown in FIGS. 13 or 14 may be used to allow passage of air 68 past the circuit board 26 to an entrance aperture 61 of the air-intake manifold 18 (shown in FIG. 11). Outer walls 48 may still support the circuit board 26 above the chamber walls 22 of the intake manifold. However, inner walls 50 are replaced by upstanding bosses 93 that allow free passage of air 68 about the lower surface of the circuit board 26 within the walls 48 within volume 60'. In this way, direct air-cooling of the active components 28 may be accomplished.

Shroud wings 96 may extend from the plate 84 to cover the harness portions 32 and may have a foot portion 98 pressing on connector 36 to hold it engaged with connector 83 of actuators 16. Thus shroud wing 96 provides not only a protective covering for the harness portions 32 but also a retention of the connectors 36.

Referring now to FIG. 12, a similar shroud wing 96' may be used when the harness portions 32 are discrete wiring as opposed to portions of the circuit board 26.

Referring now to FIG. 14, construction of the circuit board 26 for the embodiment of FIG. 12 is shown with various wire harness portions 32' connected to connectors 36.

Figure 15:
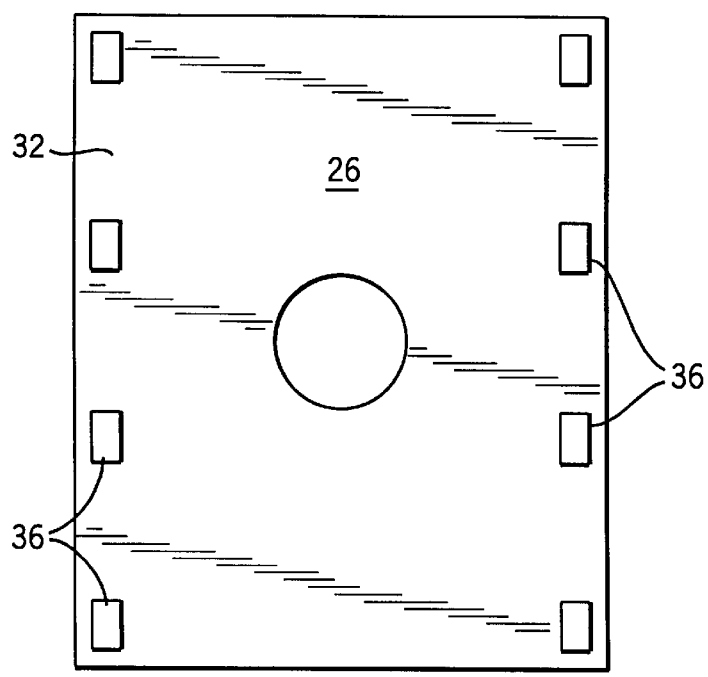
FIG. 15 shows an alternative embodiment to that of FIG. 13 in which a manifold formation of extensions is replaced with L-shaped arms.

FIG. 15 shows an alternative embodiment to the embodiment of FIG. 14 in which a single rectangular and planar sheet of flexible material is used to form circuit board 26 and harness portions 32 with connectors 36 aligned along its lateral edges.

Figure 16:
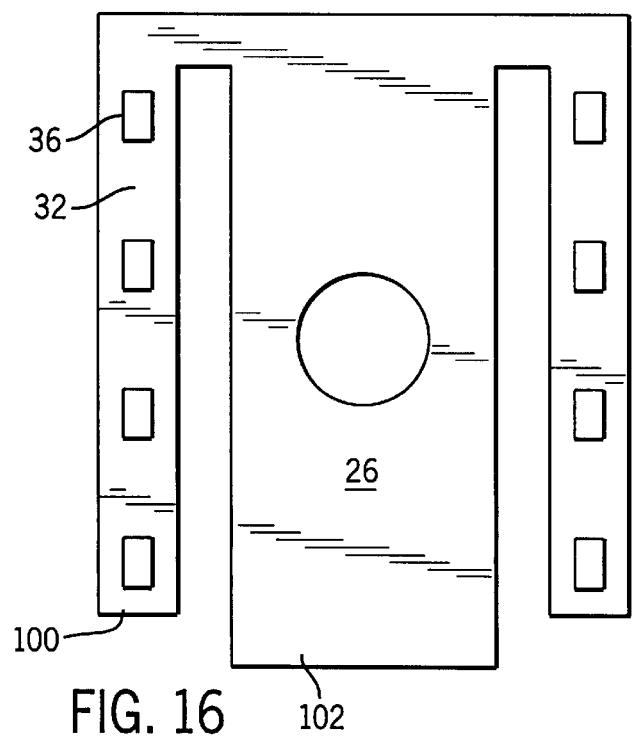
FIG. 16 is yet an alternative embodiment of the circuit card of FIG. 13 in which the arms arc not separated from one another.

In FIG. 16 yet an alternative embodiment of the circuit board 26 is shown in which the harness portions 32 are formed as L-shaped members 100 formed of two segments attached at right angles, attached to a main body 102 of the circuit 26 at an end of one of the segments, this approach conserving on flexible substrate material.

It is specifically intended that the present invention not be limited to the embodiments and illustrations contained herein, but modified forms of those embodiments including portions of the embodiments and combinations of elements of different embodiments as come within the scope of the following claims.

We claim:
1. An intake manifold circuit carrier comprising:
an air intake manifold providing chamber walls conducting air from a throttle body opening to a plurality of exit ports associated with the location of cylinders on an internal combustion engine;
support walls extending outward from the chamber walls to define a volume adjacent to the chamber walls;
a circuit board having circuit components mounted thereon and including a first aperture; and
a heat conductive plate attached to a first side of the circuit board, electrically insulated therefrom and in thermal communication therewith, to form a laminated plate assembly, the heat conductive plate having a second aperture aligned with the first aperture in the circuit board; the laminated plate assembly being attached to an upper edge of the support walls to cover the volume with the circuit board internal to the heat conductive plate with respect to the volume.

2. The intake manifold circuit carrier of claim 1 including further a throttle body having a central lumen attached to the laminated plate assembly with the lumen aligned with the first and second apertures so as to place the throttle body in thermal communication with the heat conductive plate.

3. The intake manifold circuit carrier of claim 2 wherein the throttle body includes fins projecting inward to the lumen to conduct heat from the throttle body to air passing across the fins.

4. The intake manifold circuit carrier of claim 2 wherein the heat conductive plate is integral to the throttle body.

5. The intake manifold circuit carrier of claim 1 wherein the support walls are molded heat conductive plastic.

6. The intake manifold circuit carrier of claim 1 wherein the support walls are an integral part of the intake manifold.

7. The intake manifold circuit carrier of claim 1 including elastomeric seals positioned between at least one of the circuit board and air intake manifold and the support walls.

8. The intake manifold circuit carrier of claim 1 wherein the circuit board includes outwardly extending wiring harnesses selected from the group consisting of: wires attached to the circuit board and terminating in electrical connectors, extensions of a flexible circuit board substrate of the circuit board terminating in electrical connectors, electrical connectors on a conductor assembly attached to corresponding connectors on the circuit board, the conductor assembly also attached to a controlled component, electrical connectors attached to conductors attached to the air intake manifold to connect with corresponding connectors on the circuit board, the conductors attached to the manifold terminating in another connector.

9. The intake manifold circuit carrier of claim 1 wherein the wiring harnesses are flexible circuit board having at least a first connector attaching to a corresponding connector on the circuit board and terminating in at least one second electrical connector, the flexible circuit board having a shape selected from the group consisting of: a straight segment extending between only one of the first and second connectors; a panel extending between multiple first and second connectors, two straight segments connected in an L-shape, the first segment terminating in the first connector and multiple second connectors distributed along the length of the second segment.

10. The intake manifold circuit carrier of claim 1 wherein the circuit card includes electrical connectors positioned to receive connections from the direction of the intake manifold and positioned to attach to connectors on electrical components affixed relative to the intake manifold.

11. The intake manifold circuit carrier of claim 1 wherein the circuit card includes electrical connectors positioned to receive connections from the direction opposite the intake manifold and positioned to attach to connectors on electrical components affixed relative to the intake manifold.

12. A method of assembling an intake manifold circuit system comprising the steps of:
(a) attaching a heat conductive plate to a first side of a circuit board so as to be in thermal communication with the circuit board, to form a laminated plate assembly wherein an aperture in the heat conductive plate aligns with a corresponding aperture in the circuit board;
(b) providing support walls extending outward from chamber walls of an air intake manifold to define a volume adjacent to the chamber walls, the chamber walls conducting air from a throttle body opening to a plurality of exit ports associated with the location of cylinders on an internal combustion engine; and
(c) attaching the laminated plate assembly to an upper edge of the support walls to cover the volume with the circuit board internal to the heat conductive plate with respect to the volume.

13. The method of claim 12 including the step of attaching a throttle body having a central lumen to the laminated plate assembly with the lumen aligned with the first and second apertures so as to place the throttle body in thermal communication with the heat conductive plate.

14. The method of claim 13 including the step of forming in the throttle body includes fins projecting inward to the lumen to conduct heat from the throttle body to air passing across the fins.

15. The method of claim 12 including the step of overmolding the laminated plate assembly with an elastomeric sealing material.

16. The method of claim 12 including the step of placing the laminated plate assembly in a mold and molding the support walls to the laminated plate assembly prior to attaching the support walls to the air intake manifold.

17. The method of claim 12 including wherein the support walls are molded of a heat conductive plastic.

18. The method of claim 12 including the step of forming the air intake manifold to include the support walls as an integral feature of the air intake manifold.

19. The method of claim 12 including the step of casting the air intake manifold and heat conductive plate as a single piece.

20. The method of claim 12 including the step of attaching outwardly extending wiring harnesses to the circuit board selected from the group consisting of: wires attached to the circuit board and terminating in electrical connectors, electrical connectors on a conductor assembly attached to corresponding connectors on the circuit board, the conductor assembly also attached to a controlled component, electrical connectors attached to conductors attached to the air intake manifold to connect with corresponding connectors on the circuit board, the conductors attached to the manifold terminating in another connector.

* * * * *

UNITED STATES PATENT AND TRADEMARK OFFICE
CERTIFICATE OF CORRECTION

PATENT NO. : 6,357,414 B1
DATED : March 19, 2002
INVENTOR(S) : Pawel Kalinowski, Bharat Z. Patel, Timothy J. Yerdon, John Trublowski, Prathap A. Reddy and Harvinder Singh It is certified that error appears in the above-identified patent and that said Letters Patent is hereby corrected as shown below:

Column 4,
Line 1, "FIG. 15" should be -- FIG. 16 --;
Line 4, "FIG. 16" should be -- FIG. 15 --;

Column 3,
Line 28, add semi-colon -- ; -- after "card";
Line 35, "plate." should be -- plate; --;

Column 4,
Line 5, "arc not" should be -- are not --;

Column 5,
Line 33, "arc compressed" should be -- are compressed --.

Signed and Sealed this

Nineteenth Day of November, 2002

Attest:

JAMES E. ROGAN
Attesting Officer
Director of the United States Patent and Trademark Office